United States Patent [19]
Lee

[11] Patent Number: 6,127,244
[45] Date of Patent: Oct. 3, 2000

[54] METHOD OF MANUFACTURING SEMICONDUCTOR DEVICE

[75] Inventor: Seong Eun Lee, Ich'on, Rep. of Korea

[73] Assignee: Hyundai Electronics Industries Co., Ltd., Kyoungki-do, Rep. of Korea

[21] Appl. No.: 09/220,113

[22] Filed: Dec. 23, 1998

[30] Foreign Application Priority Data

Dec. 27, 1997 [KR] Rep. of Korea ............... 97-75033

[51] Int. Cl.⁷ .................................................. H01L 21/46
[52] U.S. Cl. .................... 438/458; 438/455; 438/459; 438/928; 438/967; 438/977
[58] Field of Search .................................. 438/455, 458, 438/459, 928, 967, 977

[56] References Cited

U.S. PATENT DOCUMENTS

| | | | |
|---|---|---|---|
| 5,234,535 | 8/1993 | Beyel et al. | 156/630 |
| 5,308,776 | 5/1994 | Gotou | 437/21 |
| 5,449,638 | 9/1995 | Mong et al. | 437/61 |
| 5,476,819 | 12/1995 | Warren | 437/228 |
| 5,484,738 | 1/1996 | Chu et al. | 437/228 |
| 5,521,399 | 5/1996 | Chu et al. | 257/36 |
| 5,710,057 | 1/1998 | Kenney | 437/62 |
| 5,793,107 | 8/1998 | Nowak | 257/717 |
| 6,060,344 | 5/2000 | Matsui et al. | 438/164 |

FOREIGN PATENT DOCUMENTS

| | | | |
|---|---|---|---|
| 05160087 | 6/1993 | Japan | H01L 21/304 |
| 05291214 | 11/1993 | Japan | H01L 21/304 |
| 05252559 | 3/1995 | Japan | H01L 21/304 |
| 09116125 | 5/1997 | Japan | H01L 27/12 |

*Primary Examiner*—John F. Niebling
*Assistant Examiner*—David A Zarneke
*Attorney, Agent, or Firm*—Ladas & Parry

[57] ABSTRACT

A method of fabricating a SOI wafer using an isolation film as a polishing stopper, comprising the steps of: preparing a first and a second silicon substrates; implanting impurities into selected active regions of the first silicon substrate to a desired depth; etching the portion of the silicon substrate between the active regions to forming trenches having a desired depth; forming a first insulating layer of an oxide film on the first silicon substrate to be filled in the trenches; etching-back the first insulating layer to form a trench type isolation film; forming a second insulating layer of an oxide film on the first silicon substrate including the isolation film; bonding the first and the second silicon substrates to contact the second insulating layer with the second silicon substrate; firstly polishing the first silicon substrate by the vicinity of the portion of the first silicon substrate where the impurities are implanted; etching the polished first silicon substrate by using an etchant until the portion of the first silicon substrate where the impurities are implanted is removed; and secondarily polishing the first silicon substrate using the isolation film as a polishing stopper.

17 Claims, 4 Drawing Sheets

METHOD OF MANUFACTURING SEMICONDUCTOR DEVICE

BACKGROUND OF THE INVENTION

This invention relates to a method of manufacturing a semiconductor device, and more particularly to a method of manufacturing a silicon-on insulator(SOI) substrate having an isolation film therein.

Typically, a SOI wafer has a structure where an insulating layer is sandwiched between a substrate for supporting the SOI wafer and a substrate which a device is formed therein. Devices using the SOI wafer has advantages of complete isolation, parasitic capacitance reduction and high speed. There are typically a separation by implanted oxygen (SIMOX) method and a bonding method as a fabrication method of the SOI wafer. The SIMOX method is to fabricate a SOI wafer by implanting oxygens into a silicon substrate. The method of fabricating a SOI wafer by using a SIMOX method has a disadvantage that it is difficult to control a thickness of a silicon layer which a device is formed therein, because of forming a buried insulating layer by ion implantation. Recently, the bonding method is generally used for fabricating a SOI wafer.

FIG. 1 is a sectional view of a SOI wafer having an isolation film. A first silicon substrate 11 is prepared. Trenches are formed in the first silicon substrate 11 and a silicon oxide film 12 which is used for a polishing stopper in the following chemical mechanical polishing (CMP), is filled in the trenches. The silicon oxide film 12 is polished by a CMP process until an upper surface of the first silicon substrate is exposed, thereby forming an isolation film of the silicon oxide filled in the trenches. A buried insulating layer 14 of an oxide film is formed on the first silicon substrate 11 which the isolation film is formed therein. A second silicon substrate 13 is prepared and the first silicon substrate 11 and the second silicon substrate 13 are bonded to contact the oxide film 14 with the upper surface of the second silicon substrate 13. A heat treatment is carried out to intensify the bonding force between the first and the second substrates 11 and 13. The first silicon substrate 11 is back-side polished until the isolation film 12 of the oxide film filled in the trenches is exposed, thereby fabricating a SOI wafer 100. The remaining first silicon substrate 11 becomes a silicon active layer and the thickness of the remaining first silicon substrate 11 becomes a desired thickness of an active layer of a device formed on the SOI wafer 100.

In the prior SOI wafer fabrication method, although the silicon oxide film 12 for the isolation film buried in trenches is used for a polishing stopper in CMP process in order to obtain an uniform and thin silicon active layer, the dishing phenomenon as shown "A" in FIG. 1 that the central portion of the silicon active layer 11 is recessed rather than peripheral portion of the silicon active layer, is caused. In order to solve the problem, another method that stabilize the CMP process by controlling a concentration of slurry and a degree of acidity pH of slurry used in the CMP process, had been proposed. When the method is applied to the substrate which isolation regions having the same widths are formed therein, the dishing phenomenon is not caused. However, when the method is applied to the substrate which isolation regions having the different widths each other are formed therein, the dishing phenomenon is still exist.

SUMMARY OF THE INVENTION

There is an object of the present invention to provide a method of fabricating a semiconductor device capable of obtaining an uniform silicon layer by preventing the dishing phenomenon generating in polishing a silicon substrate.

According to an aspect of the present invention, there is provided to a method of fabricating a SOI wafer using an isolation film as a polishing stopper, comprising the steps of: preparing a first and a second silicon substrates; implanting impurities into selected active regions of the first silicon substrate to a desired depth; etching the portion of the silicon substrate between the active regions to form trenches having a desired depth; forming a first insulating layer of an oxide film on the first silicon substrate to be filled in the trenches; etching-back the first insulating layer to form a trench type isolation film; forming a second insulating layer of an oxide film on the first silicon substrate including the isolation film; bonding the first and the second silicon substrates to contact the second insulating layer with the second silicon substrate; firstly polishing the first silicon substrate by the vicinity of the portion of the first silicon substrate where the impurities are implanted; etching the polished first silicon substrate by using an etchant until the portion of the first silicon substrate where the impurities are implanted is removed; and secondarily polishing the first silicon substrate using the isolation film as a polishing stopper.

In embodiment of the present invention, first and the second polishing steps are carried out by a chemical mechanical polishing method. The polished first silicon substrate is wet-etched by using the etchant which etches the portion of the first silicon substrate which the impurities are implanted thereinto fast than the portion of the first silicon substrate which the isolation film is formed thereunder. The etchant is a compound solution of $NH_2OH$, $H_2O_2$ and $H_2O$.

In the embodiment of the present invention, the step of implanting impurities into the first silicon substrate includes the steps of: forming a mask pattern for ion implantation on the first silicon substrate to expose the active regions of the first silicon substrate; and implanting impurities into the exposed active regions of the first silicon substrate. The impurity is a boron and the implanted dose is $2 \times 10^{15} - 2 \times 10^{16}/cm^2$. The depth of the impurity implantation is deeper than that of the trench.

In the embodiment of the present invention, the step of forming the trenches includes the steps of: sequentially forming a thermal oxide and a nitride film on the first silicon substrate; forming an etching mask pattern to cover the active regions of the first silicon substrate; etching the portion of the first silicon substrate between the active regions; and removing the etching mask pattern, the thermal oxide film and the nitride film. The thermal oxide film is formed at a thickness of 50–200 Å and the nitride film is formed at a thickness of 700–1500 Å.

The method of the embodiment further comprising, between the trench formation step and the first insulating layer formation step, the step of carrying out a sacrificial oxidation process that forms a thermal oxide film in the walls of the trenches through a thermal oxidation and then removes the thermal oxide film formed in the walls of the trenches. The method of the embodiment further comprising, between the trench formation step and the first insulating layer formation step, the step of carrying out a thermal oxidation to form an oxide film in the walls of the trenches.

In embodiment of the present invention, the first insulating layer is comprised of one of $O_3$ tetraethylorthosilicate undoped silicate glass(TEOS USG) film or an oxide film formed by a high density plasma chemical vapor deposition method. When the first insulating layer is comprised of $O_3$ TEOS USG film, the first insulating layer is further heat-treated in an ambient of $N_2$, at a temperature of 950–1150° C. for 30–60 minutes. The second insulating layer is comprised of $O_3$ boro-phosphorous silicate glass ($O_3$ BPSG) and has a thickness of 3000–10000 Å.

The method of the embodiment of the present invention further comprising, between the bonding step and the first polishing step, the step of carrying out a heat treatment to intensify the bonding force between the first and the second substrates. The heat treatment is carried out in an ambient of one of $O_2$ or $N_2$, at a temperature of 800–950° C. for 10–60 minutes.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PRESENT INVENTION

Figure 1:
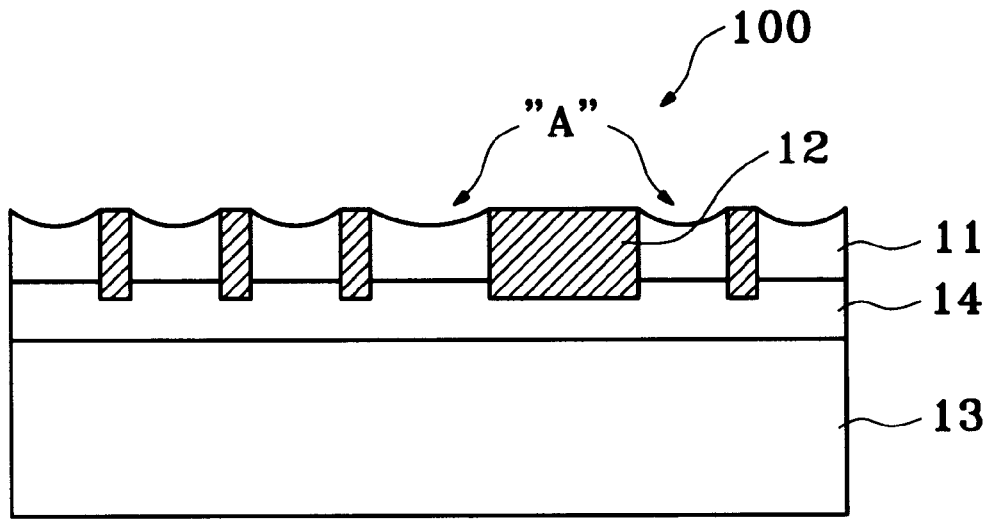
FIG. 1 is a sectional view of a SOI wafer having an isolation film in the prior art.
Figure 2A:
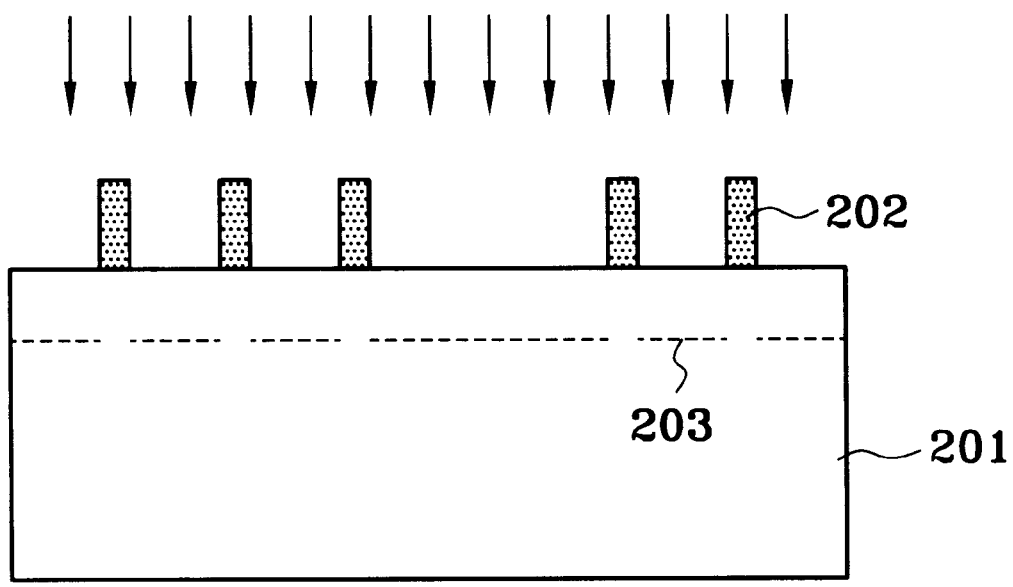
FIGS. 2A through FIG. 2I are sectional views illustrating a process for fabricating a SOI wafer having an isolation film in accordance with the present invention.

Referring to FIG. 2A, a first silicon substrate 201 is prepared. A mask pattern 202 for ion implantation is formed on the first silicon substrate 201. The mask pattern 202 is formed to cover isolation regions of the first silicon substrate 201 where isolation films are to be formed in the following process. In the embodiment, although the ion implantation mask pattern 202 is comprised of a photoresist, it may be comprised of any masking material. Impurities having a high concentration of $2\times10^{15}$–$2\times10^{16}/cm^2$, for example borons, are implanted into an exposed portion of the substrate 201 so that impurities(dopants) 203 are distributed in a desired depth of the first silicon substrate 201. The depth of the ion implantation of the dopants 204 is determined in the consideration of a thickness of an active layer and is deeper than that of trenches which are to be formed in the following process.

Figure 2B:
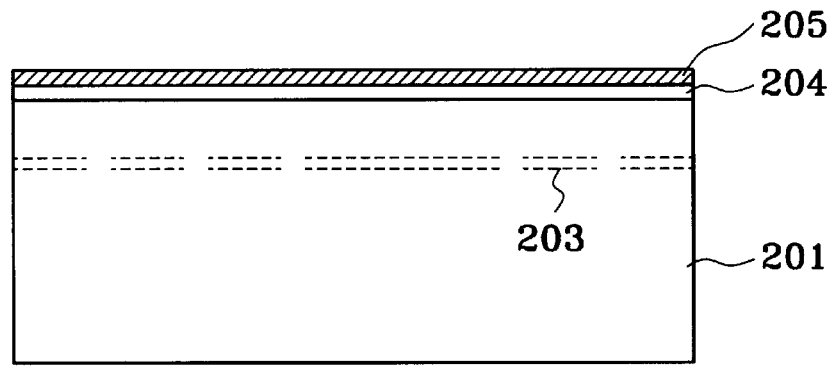
Figure 2C:
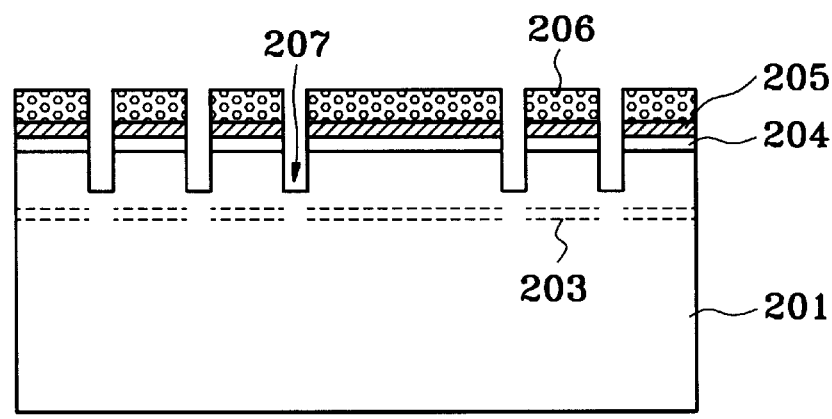

Referring to FIG. 2B, the ion implantation mask pattern 202 is removed. A thermal oxide film 204 having a thickness of 50–200 Å and a nitride film 205 having a thickness of 700–1500 Å are sequentially formed on the first silicon substrate 201. Referring to FIG. 2C, an etching mask pattern 206 for forming trenches is formed on the nitride film 205. The etching mask pattern 206 is formed to expose the portion of the nitride film 205 over the portion of the first silicon substrate 201, which the dopants 203 of the first silicon substrate 201 are distributed thereunder. The exposed nitride film 205 and the thermal oxide film 204 are etched by an etching process using the etching mask pattern 206 to expose the first silicon substrate 201. The exposed portion of the first silicon substrate 201 is etched in a desired depth, for example a depth of 500–3000 Å to form trenches 207. The etching mask pattern 206 has an inverse pattern to the ion implantation mask pattern 202. Therefore, the etching mask pattern 206 and the ion implantation mask pattern 202 are formed using the same exposure mask and the opposite photoresist films. On the other hand, following the trench formation, in order to compensate the damage in the wall of the trenches caused in forming the trenches 207, a sacrificial oxidation process that forms a thermal oxide film (not shown in drawings) in the wall of the trenches 207 through a thermal oxidation process and then removes the thermal oxide film.

Figure 2D:
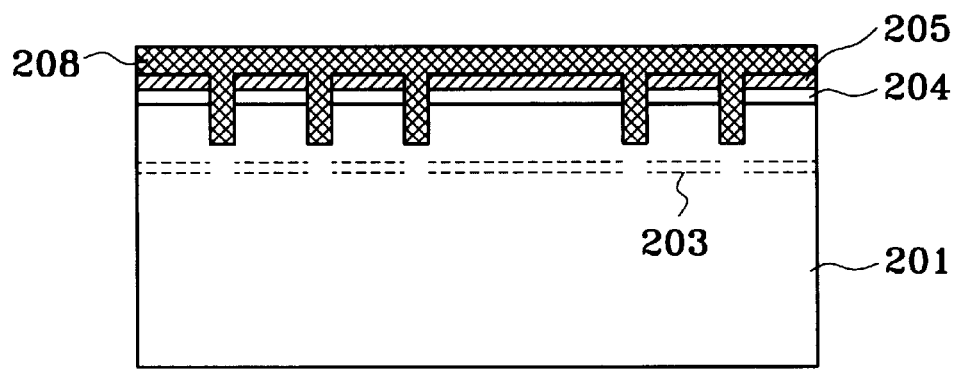

Referring to FIG. 2D, the etching mask pattern 206 is removed. A thermal oxide film (not shown in the drawings) is again formed in a thickness of 50–200 Å in the wall of trenches through another thermal oxidation process. An oxide film 208 as a first insulating layer is deposited on the resultant surface of the first silicon substrate 201 to be filled in trenches by a chemical vapor deposition method. The first oxide film 208 is comprised of an $O_3$ tetraethylorthosilicate undoped silicate glass ($O_3$ TEOS USG) film or an oxide film (HDP CVD oxide film) deposited by a high density plasma chemical vapor deposition(HDP CVD). In case an $O_3$ TEOS USG film is used for the first oxide film 208, a heat treatment is further carried out in an ambient of $N_2$, at a temperature of 950–1150° for 30–60 minutes in order to densify the $O_3$ TEOS USG oxide.

Figure 2E:
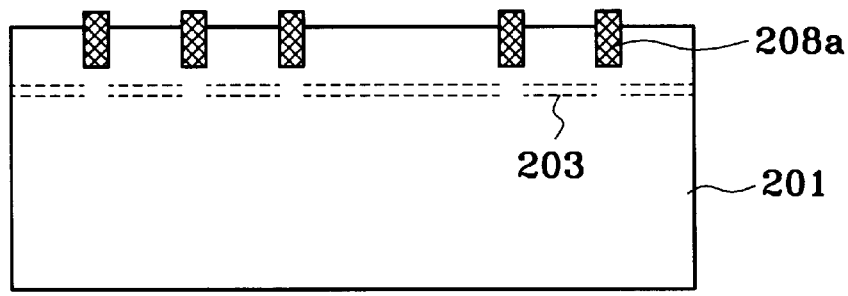
Figure 2F:
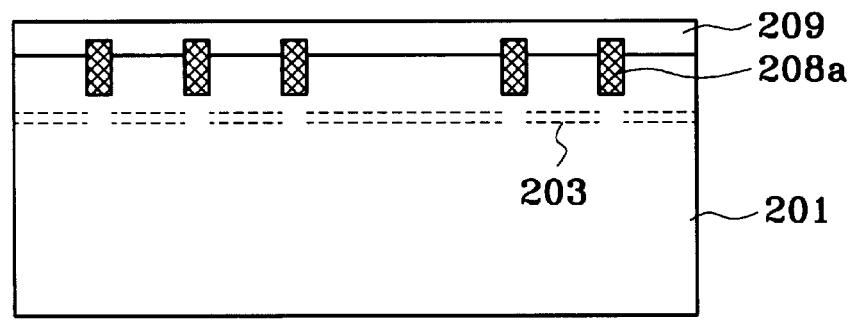

Referring to FIG. 2E, the first oxide film 208 is etched-back to expose the nitride film 205 and the nitride film 205 is removed, thereby forming an isolation region 208a of a trench type in the first silicon substrate 201. At this time, the thermal oxide film 204 may be also removed with the nitride film 205 or exist. In the embodiment, the thermal oxide film 204 is removed. Referring to FIG. 2F, an oxide film 209 as a second insulating layer for a buried insulating layer of a SOI wafer is formed on the first silicon substrate 201 having the isolation film 208a. The second oxide film is comprised of an $O_3$ boro-phosphorous silicate glass ($O_3$ BPSG) film which is deposited at a thickness of 3000–10000 Å. Following the second oxide film formation, a CMP process is carried out to polarize the surface of the first silicon substrate.

Figure 2G:
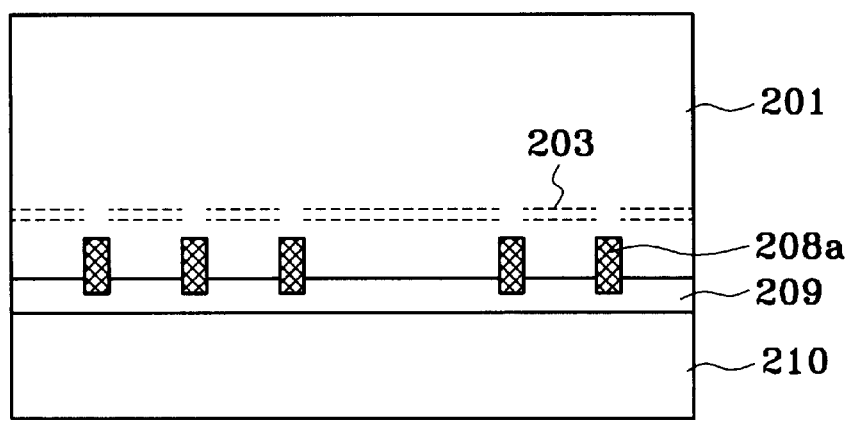
Figure 2H:
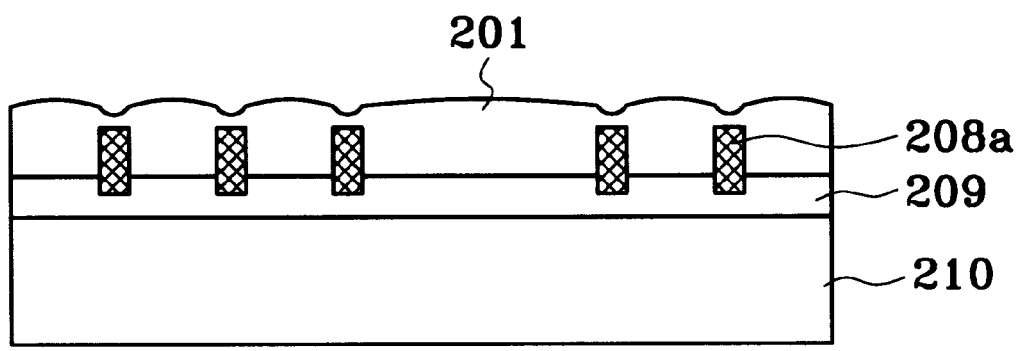

Referring to FIG. 2G, a second silicon substrate 210 is prepared. The second silicon substrate 210 and the first silicon substrate 201 are bonded to contact the second oxide film 209 with the second silicon substrate 210 and then heat-treated to intensify the boding force therebetween. The heat treatment is carried out in an ambient of $O_2$ or $N_2$, at a temperature of 800–950° for 10–60 minutes. Referring to FIG. 2H, the first silicon substrate 201 is firstly polished through a CMP process. At this time, the CMP process is carried out by vicinity of the portion of the first silicon substrate 201 where the dopants 204 are distributed. By using an etchant which etches a doped silicon layer fast than an undoped silicon layer, the first silicon substrate 201 is wet-etched until the portion of the first silicon substrate where the dopants are distributed is removed. Therefore, because the portion of the first silicon substrate which the impurities are implanted thereinto is wet-etched fast than the portion of the first silicon substrate which the isolation film is formed thereunder and the impurities are not implanted therein, the resultant surface of the substrate is as shown in FIG. 2H. That is, as a result of wet-etching of the first silicon substrate, the thickness of the portion of the first silicon substrate where the isolation film 208a is formed is thinner than that of another portion of the first silicon substrate 201. The etchant is comprised of a compound solution containing a nitric acid. For example, a compound solution of $NH_2OH$, $H_2O_2$ and $H_2O$ is used as the etchant.

Figure 2I:
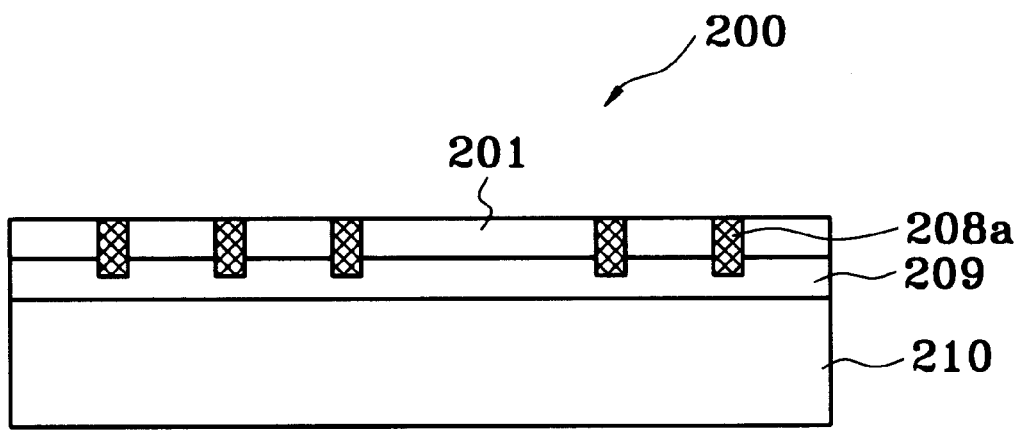

Referring to FIG. 2I, A CMP process is secondarily carried out by using the isolation film 208a as a polishing stopper, thereby forming a SOI wafer 200. According to the embodiment of the present invention, the CMP process for polishing the first silicon substrate 201 is carried out under the condition that the thickness of the portion of the first silicon substrate where the isolation film is formed is thicker that of another portion of the first silicon substrate 201 between the isolation film 208a. Therefore, the dishing phenomenon is not caused in an active layer 201 of the SOI wafer 200 between the isolation film 208a.

According to the present invention, the method for fabricating the SOI wafer prevents the dishing phenomenon generating in polishing a silicon substrate. Therefore, the uniform active silicon layer can be obtained. Besides, the following process for forming a device can be carried out with ease and the yield can be improved. Although the present invention illustrates and describes only the SOI wafer having a trench type isolation film in the embodiment, the method of the present invention is applicable to the SOI wafer having a LOCOS type isolation film.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A method of fabricating a semiconductor device, comprising the steps of:

preparing a first and a second silicon substrates;

implanting impurities into selected active regions of the first silicon substrate to a desired depth;

etching the portion of the silicon substrate between the active regions to form trenches having a desired depth;

forming a first insulating layer on the first silicon substrate to be filled in the trenches;

etching-back the first insulating layer to form an isolation film which is formed within the trenches;

forming a second insulating layer on the first silicon substrate including the isolation film;

bonding the first and the second silicon substrates to contact the second insulating layer film with the second silicon substrate;

firstly polishing the first silicon substrate by the vicinity of the portion of the first silicon substrate where the impurities are implanted;

etching the polished first silicon substrate by using an etchant until the portion of the first silicon substrate where the impurities are implanted, is removed; and secondarily polishing the first silicon substrate using the isolation film as a polishing stopper.

2. The method as claimed in claim 1, wherein the step of implanting impurities into the first silicon substrate includes the steps of:

forming a mask pattern for ion implantation on the first silicon substrate to expose the active regions of the first silicon substrate; and implanting impurities into the exposed active regions of the first silicon substrate.

3. The method as claimed in claim 2, wherein the impurity is a boron and the implanted dose is $2 \times 10^{15} - 2 \times 10^{16} / cm^2$.

4. The method as claimed in claim 3, wherein the polished first silicon substrate is wet-etched by using the etchant which etches the portion of the first silicon substrate which the impurities are implanted thereinto fast than the portion of the first silicon substrate which the isolation film is formed thereunder.

5. The method as claimed in claim 4, wherein the etchant for etching the polished first silicon substrate is a compound solution of $NH_2OH$, $H_2O_2$ and $H_2O$.

6. The method as claimed in claim 2, wherein the depth of the impurity implantation is deeper than that of the trench.

7. The method as claimed in claim 1, wherein the step of forming the trenches includes the steps of:

sequentially forming a thermal oxide and a nitride film on the first silicon substrate;

forming an etching mask pattern to cover the active region of the first silicon substrate;

etching the portion of the first silicon substrate between the active regions to form the trenches; and removing the etching mask pattern, the thermal oxide film and the nitride film.

8. The method as claimed in claim 7, wherein the thermal oxide film is formed at a thickness of 50–200 Å and the nitride film is formed at a thickness of 700–1500 Å.

9. The method as claimed in claim 1, wherein between the trench formation step and the first insulating layer formation step, further comprising the step of carrying out a sacrificial oxidation process that forms a thermal oxide film in the walls of the trenches through a thermal oxidation and then removes the thermal oxide film formed in the walls of the trenches.

10. The method as claimed in claim 1, wherein between the trench formation step and the first insulating layer formation step, further comprising the step of carrying out a thermal oxidation to form an oxide film in the walls of the trenches.

11. The method as claimed in claim 1, wherein the first insulating layer is comprised of one of $O_3$ tetraethylorthosilicate undoped silicate glass(TEOS USG) film or an oxide film formed by a high density plasma chemical vapor deposition method.

12. The method as claimed in claim 11, wherein when the first insulating layer is comprised of $O_3$ TEOS USG film, the first insulating layer is further heat-treated in an ambient of $N_2$, at a temperature of 950–1150° C. for 30–60 minutes.

13. The method as claimed in claim 1, wherein the second insulating layer is comprised of $O_3$ boro-phosphorous silicate glass ($O_3$ BPSG).

14. The method as claimed in claim 13, wherein the second insulating layer has a thickness of 3000–10000 Å.

15. The method as claimed in claim 1, wherein between the bonding step and the first polishing step, further comprising the step of carrying out a heat treatment to intensify the bonding force between the first and the second substrates.

16. The method as claimed in claim 15, wherein the heat treatment is carried out in an ambient of one of $O_2$ or $N_2$, at a temperature of 800–950° C. for 10–60 minutes.

17. The method as claimed in claim 1, wherein the first and the second polishing steps are carried out by a chemical mechanical polishing method.

* * * * *